United States Patent
Gates et al.

(10) Patent No.: US 9,318,415 B2
(45) Date of Patent: Apr. 19, 2016

(54) BEOL STRUCTURES INCORPORATING ACTIVE DEVICES AND MECHANICAL STRENGTH

(71) Applicant: GLOBALFOUNDRIES Inc., Grand Cayman (KY)

(72) Inventors: Stephen M Gates, Ossining, NY (US); Daniel C. Edelstein, White Plains, NY (US); Satyanarayana V. Nitta, Poughquag, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/148,532

(22) Filed: Jan. 6, 2014

(65) Prior Publication Data

US 2014/0117457 A1    May 1, 2014

Related U.S. Application Data

(63) Continuation of application No. 13/149,797, filed on May 31, 2011, now Pat. No. 8,624,323.

(51) Int. Cl.
| | |
|---|---|
| *H01L 23/48* | (2006.01) |
| *H01L 27/06* | (2006.01) |
| *H01L 25/18* | (2006.01) |
| *H01L 21/02* | (2006.01) |
| *H01L 23/00* | (2006.01) |
| *H01L 25/00* | (2006.01) |
| *H01L 29/66* | (2006.01) |
| *H01L 29/861* | (2006.01) |
| *H01L 29/872* | (2006.01) |
| *H01L 23/522* | (2006.01) |
| *H01L 23/532* | (2006.01) |
| *H01L 27/01* | (2006.01) |

(52) U.S. Cl.
CPC ........ *H01L 23/481* (2013.01); *H01L 21/02667* (2013.01); *H01L 24/80* (2013.01); *H01L 25/18* (2013.01); *H01L 25/50* (2013.01); *H01L 27/0688* (2013.01); *H01L 23/5223* (2013.01); *H01L 23/5226* (2013.01); *H01L 23/5227* (2013.01); *H01L 23/5228* (2013.01); *H01L 23/53238* (2013.01); *H01L 27/016* (2013.01); *H01L 29/66984* (2013.01); *H01L 29/861* (2013.01); *H01L 29/872* (2013.01); *H01L 2924/12032* (2013.01); *H01L 2924/1305* (2013.01); *H01L 2924/1306* (2013.01)

(58) Field of Classification Search
CPC ......... H01L 25/18; H01L 25/00; H01L 23/00; H01L 29/92; H01L 29/772; H01L 29/02; H01L 29/78
USPC .......... 257/368, 499, 531, 532, 536, 741, 774
See application file for complete search history.

(56) References Cited

U.S. PATENT DOCUMENTS

| | | |
|---|---|---|
| 4,939,568 A | 7/1990 | Kato et al. |
| 6,821,826 B1 | 11/2004 | Chan et al. |

(Continued)

*Primary Examiner* — Chuong A Luu
(74) *Attorney, Agent, or Firm* — Anthony Canale; Andrew M. Calderon; Roberts, Mlotkowski, Safran & Cole PC

(57) ABSTRACT

An integrated circuit and method includes a substrate, a plurality of semiconductor device layers monolithically integrated on the substrate, and a metal wiring layer with vias interconnecting the plurality of semiconductor device layers. The semiconductor device layers are devoid of bonding or joining interface with the substrate.

20 Claims, 10 Drawing Sheets

(56) References Cited

U.S. PATENT DOCUMENTS

| | | |
|---|---|---|
| 6,882,045 B2 | 4/2005 | Massingill et al. |
| 7,312,487 B2 | 12/2007 | Alam et al. |
| 7,723,207 B2 | 5/2010 | Alam et al. |
| 8,624,323 B2 * | 1/2014 | Gates et al. .................. 257/368 |
| 2007/0289127 A1 | 12/2007 | Hurwitz et al. |
| 2008/0258300 A1 | 10/2008 | Kobayashi et al. |
| 2010/0081232 A1 * | 4/2010 | Furman et al. ................ 438/107 |
| 2011/0039375 A1 | 2/2011 | Nakagawa et al. |
| 2013/0001771 A1 | 1/2013 | Pagaila et al. |

* cited by examiner

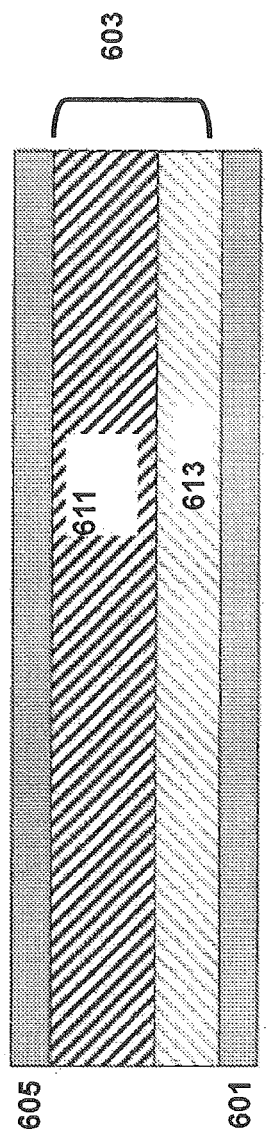
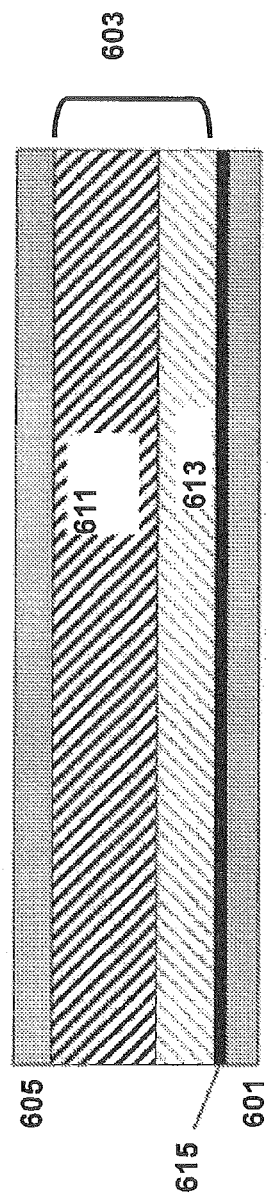
FIG. 7A
FIG. 7B

BEOL STRUCTURES INCORPORATING ACTIVE DEVICES AND MECHANICAL STRENGTH

The present application is a Continuation application of U.S. patent application Ser. No. 13/149,797, filed on May 31, 2011 now U.S. Pat. No. 8,624,323, the entirety of which is incorporated herein by reference.

BACKGROUND OF THE INVENTION

1. Field of the Invention

The disclosed invention relates generally to fabrication of integrated circuits, and more particularly, but not by way of limitation, to wiring levels on an integrated circuit in a back-end-of-line (BEOL) processing that include active and/or nonlinear devices embedded therein.

2. Description of the Related Art

From the beginning of semiconductor manufacture, there has been a progressive trend to miniaturizing electrical components through dimension scaling, thereby resulting in increased circuit density over time. In the general manufacturing scheme of an integrated circuit (IC), there are two major parts, the front end of line (FEOL) processing and the back end of line (BEOL) processing.

In general, the FEOL layer contains active and nonlinear devices requiring a semiconductor, such as transistors, diodes, varactors, photodetectors, photo-emitters, polysilicon resistors, MOS (metal-oxide-silicon or metal-oxide-semiconductor) capacitors, waveguides, waveguide modulators, etc. The BEOL contains passive, linear devices made from metals and insulators, such as signal and power wires, transmission lines, metal resistors, metal-insulator-metal (MIM) capacitors, inductors, fuses, etc. The FEOL processing may include a transistor and other active or nonlinear devices being formed on a semiconducting wafer surface, for example a Si wafer, and the back end of line (BEOL) may include the devices being wired together with a patterned multilevel metallization processes.

To support the increased component density, a hierarchical wiring method was developed for the BEOL, in which multiple levels of interconnect wires are fabricated in a level-by-level scheme. The BEOL then generally includes a plurality of wiring levels to provide interconnections for the FEOL devices to carry the signals therebetween. A set of far BEOL (FBEOL) connections is formed, and the integrated circuit (IC) is then finally protected by a sealing layer. Completed IC's are tested, including a plurality of electrical tests to determine a proportion of the devices on the wafer that perform within certain preset parameters to provide a yield.

To fabricate the BEOL interconnect layers, a damascene or dual damascene process is commonly used and is known in the art. The dual damascene process allows for hierarchical wiring management and reduced cost.

As dimension scaling reaches fundamental limits, one general approach to increase the IC density and functionality has been to combine two prefabricated IC's in a stacked or three dimensional (3-D or 3D) IC. This is a high cost solution. For example, wafer bumping is one 3D packaging technology, in which two or more layers of active electronic components are integrated into a single 3D circuit or package. Currently, a 3D integrated (IC) chip requires that more than one IC layer be fabricated independently (be it partial or full fabrication), stacked, and then packaged together. The yield in the latter steps is low, again leading to increased cost. Therefore, a new method is needed to help in the wiring of the devices in order to help increase the circuit density and still provide a high yield and reduced cost.

The prefabrication of more than one integrated circuit (IC) also requires that more than one silicon wafer be used. A separate substrate is necessary for each prefabricated device layer that is bonded together. Moreover, there are many extra steps and inherent problems of the subsequent stacking and bonding of the ICs, and these steps lead to increased cost of the stacked 3-D IC. In one example, two IC chips can be bonded together with the aid of insulating and adhesive layers in order to stack two IC chips together. The bonding can be made by thermo-compression, fusion bonding, oxide bonding, or by use of an intermediate bonding layer, for example, an adhesive.

Generally, a bonded structure can include a semiconductor device layer stack and a first set of functional elements, such as BEOL interconnect elements. The BEOL interconnect elements can at least partially connect the circuits present in the semiconductor device layer. The stacked components are separately formed, and then bonded after being stacked. However, in order to implement a 3D stacked IC solution, reliability and high yields of individual elements along with very high bonding yields and precise alignment methods need to be realized.

There have been a plurality of other problems in the bonding process including having to deal with the forces that are required to form a strong wafer bond. For example, higher forces acting on a mechanically weak BEOL structure may damage that structure. Then, the prefabricated device layers must be modeled and modified in design in order to take account of the inherent forces due to deformation during bonding and subsequent cool down.

Additionally, there are problems with the bonded contacts. These include reliability over use, defects, and degradation of circuit performance. There are also problems in that extra steps are necessary for the fabrication process at the back-end in order to have more than one active layer. This can increase costs and increase the possible defects of the final product.

Therefore, there is also a need to improve the overall mechanical strength of the BEOL hierarchical wiring structures.

Moreover, there is a problem in reduced yield as the circuit density has increased. Additionally, the performance of signals traveling through interconnects has degraded with the increased wiring density. The BEOL interconnects have become mechanically weaker with the use of low-k and porous dielectrics to regain signal performance.

There is a need for increased density and high perfoiniance in the integrated circuits such that circuit function can be distributed amongst a plurality of circuit layers without adversely impacting circuit performance and increasing manufacturing costs.

Therefore, it is also desirable to provide improved BEOL structures incorporating individual devices interconnected with wiring on the wafer that allows for increased circuit density as compared to present day chips while still increasing performance and yield.

SUMMARY OF INVENTION

In view of the foregoing and other problems, disadvantages, and drawbacks of the aforementioned background art, an exemplary aspect of the disclosed invention provides wiring levels on an integrated circuit, such as damascene Cu wiring levels on an integrated circuit. Commonly, the damascene Cu wiring levels are fabricated in a low-κ dielectric having a tensile stress, although oxide dielectrics having compressive stress are also used. Herein, the term "silicon nitride" (SiN) is used to include an alloy of silicon and nitrogen, and also an alloy of silicon, carbon, and nitrogen (SiCN), and both these alloys may include hydrogen (H).

Another exemplary aspect of the disclosed invention is to provide a termination of at least one damascene Cu wiring level (fabricated in a low-κ dielectric, either porous or non-porous, or in a dense oxide dielectric), with a semiconductor active or nonlinear device layer, including sublayers, for example, of a semiconductor, a metal, and an insulator. In contrast to the related art, this layer of semiconductor active and/or nonlinear devices is integrated within the wiring levels, as opposed to bonded from a separate substrate. No bonding interface exists within the active/nonlinear device layer of this invention. In contrast to the related art, this layer of semiconductor active and/or nonlinear devices is located under the sealing layer and FBEOL connections.

Another exemplary aspect of this invention is to provide the internal stress of a semiconductor layer having active nonlinear devices in order to provide a substrate with a near-zero curvature after completion of the active semiconductor layer.

Yet another exemplary aspect of this invention provides a termination of at least one damascene Cu wiring level with a semiconductor layer in which nonlinear devices and active circuits are located in the semiconductor layer and are connected as a single integrated circuit based on one Si wafer base layer.

It is still another exemplary aspect of this invention to provide additional circuit functions, the circuit functions being located within an active semiconductor layer including sub-layers.

In accordance with one exemplary aspect of the disclosed invention, a monolithic integrated circuit is provided, including a substrate, a plurality of nonlinear semiconductor device layers formed above the substrate, and at least one metal wiring layer with vias interconnecting the plurality of semiconductor device layers. Generally, the monolithic integrated circuit also includes a single sealing layer and a set of FBEOL connections above the plurality of semiconductor device layers.

The nonlinear semiconductor device layers are interconnected by the at least one metal wiring layer constructed within a dielectric layer. The dielectric layer is deposited on the substrate. The plurality of nonlinear or active semiconductor devices are fabricated in the plurality of semiconductor device layers. More specifically, the plurality of devices are embedded within the BEOL wiring layers, with no bonding or joining interface such as would be required for such layers fabricated on a separate substrate. A first dielectric layer is deposited on the one metal wiring layer. Having these aspects, the integrated circuit of this exemplary aspect of the invention is called "monolithic". Further aspects of the monolithic IC are now described.

The at least one metal wiring layer is terminated by depositing a first silicon nitride (SiN) or SiCN layer. Above a first silicon nitride layer located atop the one metal wiring level having at least one lower damascene Cu wiring level, a non-linear semiconductor device layer is formed by deposition on the substrate.

A nonlinear device is formed on at least one of the plurality of semiconductor device layers. In one example embodiment, the nonlinear device includes a first principal electrically conducting channel, a second conductor contact of the principal electrically conducting channel, and a control conductor, the control conductor regulating a current flow between the first conductor and the second conductor of the principal electrically conducting channel. The device of this example embodiment includes the first, second and control conductors connected to at least one of the metal wiring levels.

In a specific embodiment, the plurality of nonlinear semiconductor devices includes a plurality of transistors. Gate, source, and drain conductor contacts of the transistors are connected to the metal wiring level located above said transistors. The gate, source, and drain conductor contacts of the transistors are fabricated through a second dielectric layer deposited on the semiconductor device layer. The second dielectric layer acts to encapsulate the contacts and the non-linear device. The contacts may be optionally made using the shallow vias described below.

In another example embodiment, the nonlinear device includes a first conductor of a principal electrically conducting region, a second conductor of the principal electrically conducting region and a change in dopant concentration within the conducting region. The device of this example embodiment includes the first and second conductors connected to at least one of the metal wiring levels. This device performs a rectification or diode function.

The intrinsic stress in the first and second dielectric layers can be adjusted to minimize a net curvature of the substrate after completion of said second dielectric layer. This feature provides a BEOL wiring structure with an enhanced resistance to cracking, delamination, etc., when the inventive monolithic IC is diced and packaged.

In accordance with another exemplary aspect of the disclosed invention, a monolithic integrated circuit includes a substrate, a first wiring layer formed on the substrate, a first dielectric layer connected with the first wiring layer in the substrate, a first semiconductor layer comprising an active device formed in the substrate, a second dielectric layer formed on the first semiconductor layer in the substrate, and a second wiring layer formed on the second dielectric layer, and a second semiconductor layer, the second semiconductor layer is located in a BEOL (back-end-of-line) structure. The second semiconductor device layers are not continuous all across the substrate, but can be patterned into regions.

In accordance with another exemplary aspect of the disclosed invention, a method to fabricate a monolithic integrated circuit using a single substrate includes fabricating semiconductor devices on the substrate, fabricating at least one metal wiring layer on the devices, terminating the metal wiring layer with a layer of dielectric in adhesive contact with a second semiconductor layer, attaching a dielectric layer to the second semiconductor layer, and forming nonlinear devices in the second semiconductor layer.

In one example of this method, there is depositing of a layer of passivation dielectric (PD) on the semiconductor layer, as the second dielectric layer. The PD preferably has an internal compressive stress greater than 20 GPa. There are further steps of forming of two kinds of interconnects including the first and second wiring layers within the first dielectric. There are through-vias that do not pass through the plurality of semiconductor layers. Additionally, there are shallow vias that make electrical contact to one of the first semiconductor layers. The first or second dielectric layer preferably is planarized by CMP to remove topography.

There has thus been outlined, rather broadly, certain exemplary embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one exemplary embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF DRAWINGS

The exemplary aspects of the invention will be better understood from the following detailed description of the exemplary embodiments of the invention with reference to the drawings.

FIG. 7A shows a sub-layer within an active layer of the vertical diode nonlinear device of FIG. 6.

FIG. 7B illustrates another exemplary embodiment of the sub-layer of the vertical diode nonlinear device of FIG. 6.

DETAILED DESCRIPTION OF A PREFERRED EMBODIMENT

Figures 1A, 1B:
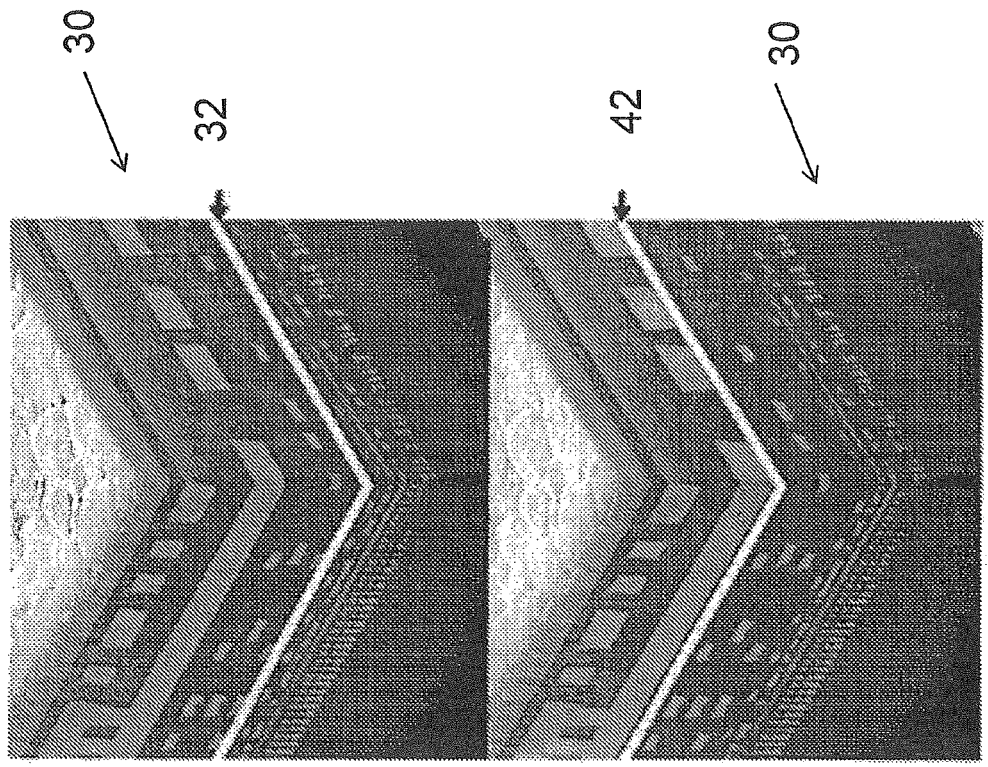
FIGS. 1A and 1B illustrate a semiconductor (or multifunction) active layer in a BEOL of a monolithic IC.

The invention will now be described with reference to the drawing figures, in which like reference numerals refer to like parts throughout. It is emphasized that, according to common practice, the various features of the drawing are not necessary to scale. On the contrary, the dimensions of the various features can be arbitrarily expanded or reduced for clarity. Exemplary embodiments are provided below for illustration purposes and do not limit the claims.

The exemplary disclosure describes, at least in part but not limited to, creating an integrated circuit with two or more levels of active device, whereas the related art has one level. In the related art, two independent layers are bonded together, whereas in the present exemplary disclosure there is a building in a stepwise fashion and using a single substrate. In the related art, two layers can be fabricated independently and then bonded together. Therefore, in the exemplary embodiments, there is a building of the multiple semiconductor layers with nonlinear devices as the process proceeds in a stepwise fashion and using only a single substrate. Therefore, a monolithic integrated circuit is formed, and the semiconductor layers are described as monolithically integrated.

The exemplary embodiments also relate to a structure that is a nonlinear device layer with interconnects both above and below. The interconnects are attached to both surfaces of the device layer. The method and structure of the exemplary disclosure does not prefabricate devices or integrated circuits on separate wafers.

The exemplary embodiments also provide a monolithic IC with more than one semiconductor nonlinear device layer under a single sealing layer.

Generally, the examples also include damascene Cu wiring levels on an integrated circuit, with the damascene Cu wiring levels fabricated in a low-κ dielectric having a tensile stress. The exemplary embodiments shown also provide a termination of at least one damascene Cu wiring level (fabricated in a low-κ dielectric, either porous or non-porous), with a semiconductor layer having nonlinear devices including sublayers. In one example, the sub-layers are a first semiconductor layer including Si (silicon) and a second layer of silicon nitride (e.g. $Si_3N_4$, $SiN_x$, SiN) or SiCN alloy, or silicon oxide (e.g. silicon dioxide, $SiO_2$). In other examples, the first semiconductor sublayer includes alloys of Si such as $Si_xC_y$, $Si_xGe_y$, a III-V semiconductor, or a II-VI semiconductor, and the dielectric layers include silicon nitride (e.g. $Si_3N_4$, $SiN_x$, SiN) or silicon oxide (e.g. silicon dioxide, $SiO_2$).

The exemplary embodiments also provide a way to adjust the internal stress of the semiconductor layer with active devices in order to provide a substrate with a near zero curvature after completion of the semiconductor layer. The exemplary embodiments provide a termination of at least one damascene Cu wiring level with the semiconductor layer in which Si transistors and active circuits are located in the semiconductor layer and are connected as part of the integrated circuit based on the Si wafer base layer.

The exemplary embodiments also provide a circuit function or a combination of circuit functions selected from a plurality of circuit functions, the circuit function being located within semiconductor layer comprised of both Si and SiN (silicon nitride) sublayers.

The exemplary embodiments provide an increase in density and add new functions to integrated circuits, by providing a monolithic IC structure. A plurality of exemplary problems are solved, including a high mechanical strength layer being placed in the BEOL of an integrated circuit to enable chip packaging using lower strength ILDs (interlayer dielectrics) in the BEOL, and also active circuits being fabricated in the semiconductor device layer (e.g., Si layer) in the BEOL to increase circuit density compared to present day IC chips.

A semiconductor layer is fabricated in the BEOL. The semiconductor layer includes devices, circuits, and a plurality of features or functions including, but not limited to the following list.

One feature or function (1) includes mechanical strength. The dielectric is preferably an oxide or nitride with high modulus and compressive stress. A preferred example is a very highly compressive stress nitride, SiN. This feature of mechanical strength provides the monolithic IC of the exemplary disclosed invention with a strong BEOL structure that enables success in dicing and packaging the IC.

Another feature or function (2) includes an active semiconductor layer, e.g. laser-recrystallized Si and associated doping, gate dielectric, and silicide layers so as to allow nonlinear devices listed below to be formed at low temperatures compatible with the underlying metal wiring levels.

Another feature or function (3) includes devices in this layer that are active and passive devices or elements. The devices or elements include interconnects, metal thin film resistors, varactors, inductors, MIM (metal-insulator-metal) capacitors, thin film silicon devices such as field effect transistors, bipolar transistors, spin-enhanced field effect transistors, tunneling transistors, ferroelectric gate field effect transistors, tunnel diodes, junction diodes, and photonic elements such as light emitters, photodetectors, waveguides, and optical modulators. The devices or elements recited are not an exhaustive list, but can be equivalent or similar devices or elements or other types of active or passive devices that are not mentioned in the example list including other linear or non-linear elements. The devices or elements provided in the semiconductor layer can be selected from any one or combination of the active or passive elements or equivalents.

Another feature or function (4) includes that within the layer, single or dual damascene Cu vias and/or lines are located to connect the Cu damascene levels above and below. Possibly a second metal or metal alloy conductor which acts as a Cu diffusion barrier, such as TaN, Ta, TiN, Ti, WN, W, etc., is in contact with Cu, and possibly allowing displaced contacting so as not to place a semiconductor material such as Si or other materials named above in direct contact with Cu. Optionally, multilayers of these barrier materials may be used.

Yet another feature or function (5) includes circuits fabricated in the layer. The circuits include, but are not limited to, repeater circuits, I/O (input/output) drivers, tamper-resistant circuits, other encoding and reconfigurable circuits, access circuits for memory arrays, image processing accelerator circuits, radiofrequency (RF) signal processing circuits, photonic signal processing circuits, and the like, equivalents or any combination thereof. Once again, this list of exemplary circuits fabricated in the layer is not exhaustive.

The above list of features and functions, provided in the semiconductor layer that is fabricated in the BEOL, is not exhaustive. For example, the list can include features or functions that are equivalent or similar to ones mentioned above. Moreover, a selection from the list of features or functions can be made from any one of the features and functions or any combination thereof.

Referring to FIGS. 1A and 1B, an example of a semiconductor (or multifunction) active layer in a BEOL is shown. The high mechanical strength layer is indicated in the bands 32 and 42 within a Cu BEOL on an integrated circuit 30.

Figure 2:
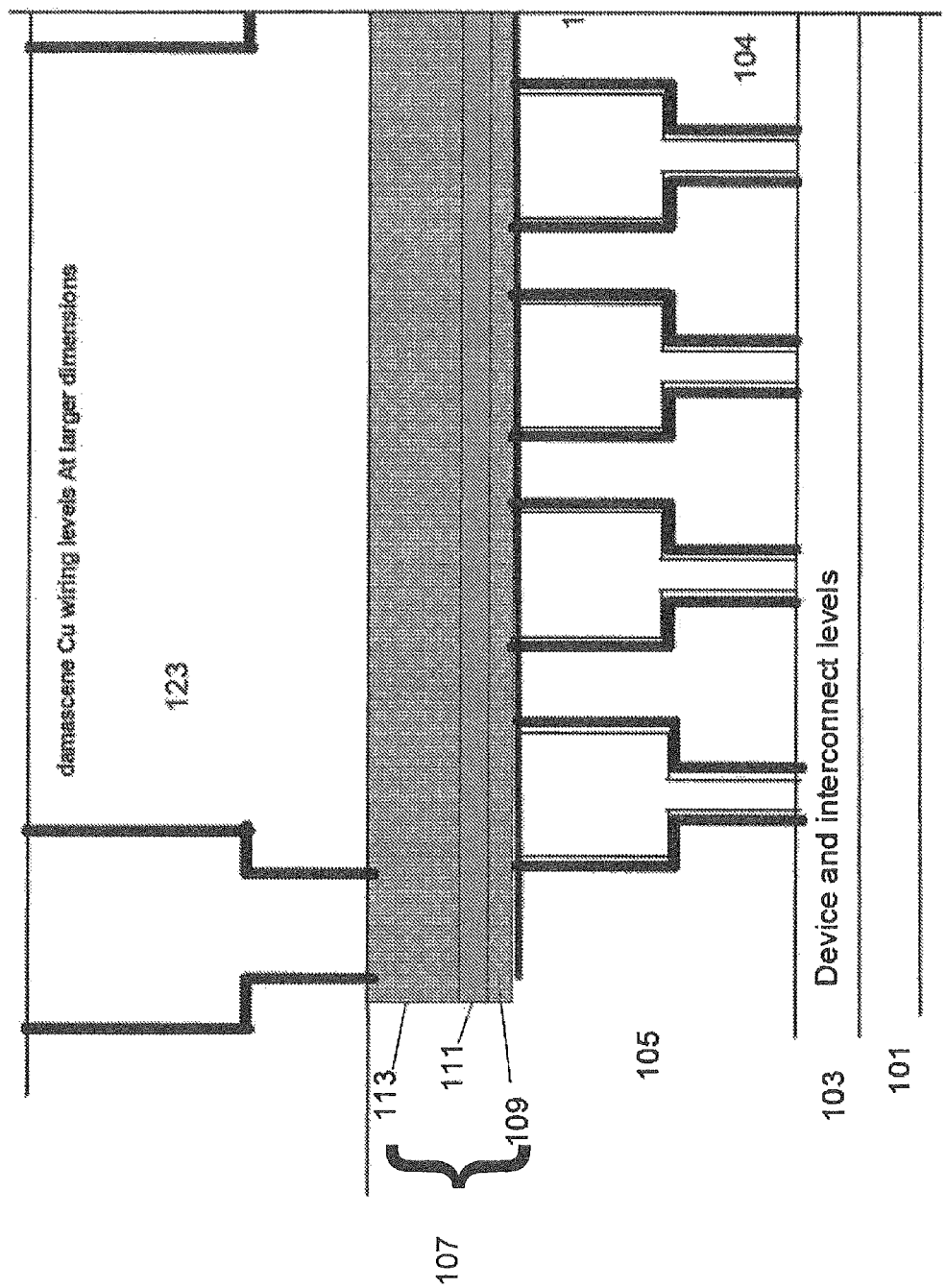
FIG. 2 provides a general view of a high mechanical strength semiconductor active layer.

Referring to FIG. 2, general features of the active semiconductor layer 107 with high mechanical strength are illustrated. The exemplary embodiment described here provides the active semiconductor layer (or multifunction layer) 107 within the BEOL wiring levels of an integrated circuit where the active semiconductor layer 107 includes Si transistors connected to perform circuit functions or features such as listed above in functions (1) to (5). The active semiconductor layer 107 can include the active elements or devices, such as but not limited to, the ones listed above for features or functions (1) to (5). For example, the devices can include nonlinear devices.

Further, this exemplary disclosure provides a very high mechanical strength termination of at least one Damascene Cu interconnect layers, by locating the Si circuit functions within a dielectric that has a modulus greater than 20 GPa (gigapascals) and an intrinsic stress that is adjusted according to the stress characteristics of the BEOL wiring levels of the integrated circuit.

The high modulus of the multifunction layer serves to raise the average (effective) modulus of the collective BEOL interconnect structure, resulting in an integrated circuit chip with high mechanical strength that is designed to undergo chip to package bonding with no mechanical failure. The circuit functions or features, as exemplified above, of the active semiconductor layer 107 serve to enhance the function of the integrated circuit.

In further detail, referring again to FIG. 2, a substrate 101 contains integrated circuit devices 103 and the integrated circuit devices 103 are connected through a damascene Cu wiring level (or a BEOL metal wiring level) 105. The Cu wiring can include other metals within the wiring.

Optionally, there are a plurality of damascene Cu wiring levels, but only one such level is shown here as an example (i.e., an interconnect or damascene Cu wiring level 105). A wiring level is terminated with a dielectric. Therefore, in order to complete the damascene Cu wiring level 105, a layer of SiN or SiCN alloy, as examples of a first dielectric layer 109 known as the Cu cap, is provided with the damascene Cu wiring level. Other types of dielectrics can be used. The first dielectric layer 109 can help prevent the reaction between above and below the first dielectric layer 109. The first dielectric layer 109 can be a SiN layer, which is in strong adhesive contact with the damascene Cu wiring level 105.

Atop or stacked above the first dielectric (e.g., SiN or SiCN) layer 109 is a first semiconductor layer (e.g. Si device) layer 111. The first semiconductor layer 111 can be any type of semiconductor, including but not limited to Si. The crystal structure of the first semiconductor layer (or Si device layer) 111 is different in other exemplary embodiments. The layer can be crystalline, polycrystalline, or amorphous. The layer can be an alloy of Si (SiC, SiGe, SiGeC), or a compound III-V or II-VI semiconductor. A second wiring level 123 can be included above the active semiconductor 107. Therefore, there are interconnects both above and below the active semiconductor layer 107 and all the mentioned layers are formed on a single substrate 101.

The first semiconductor layer 111 can be made of low thermal budget process for recrystallization so that the semiconductor, such as Si, can have a crystal structure with desirable semiconductor properties that may be superior to an amorphous Si structure. This crystal structure, through the low thermal budget process for recrystallization, provides the support for the devices fabricated in this layer. The process used for creating the crystal structure is not limited to low thermal budget process for recrystallization, but can be other similar or equivalent processes, so long as they are compatible with any thermal limitations of the existing, underlying wiring levels. For example, methods with a low thermal budget include, but are not limited to, rapid thermal annealing, pulsed continuous-wave laser annealing, nanosecond-pulsed laser annealing, and ultraviolet light assisted annealing.

In this exemplary embodiment, the Si device layer or first semiconductor layer 111 has characteristics of a crystalline layer evidenced by narrow X-ray diffraction peaks for the Si lattice and detected by other diffraction methods such as electron diffraction in a transmission electron microscopy (TEM).

In another embodiment, the first semiconductor layer (or Si device layer) 111 may be a polycrystalline Si (poly-Si) layer evidenced by broad diffraction peaks in X-ray diffraction and by grain boundaries seen in TEM and by other diffraction methods in a TEM. This layer is formed by deposition of Si followed by a crystallization step, for example pulsed nanosecond laser anneal crystallization. In other embodiments, the first semiconductor layer can be another material and crystallized by other methods.

In one exemplary embodiment, the first semiconductor layer 111 may be continuous across the integrated circuit chip, while in other embodiments the first semiconductor layer 111 is patterned during fabrication into discrete regions or islands.

Common to all exemplary embodiments provided with regard to the example of FIG. 2, atop the first semiconductor layer (e.g., Si layer) 111 is a second dielectric layer 113. Together, layers including, but not limited to, the first dielectric layer 109, the first semiconductor layer 111 and the second dielectric layer 113 include the active semiconductor (multifunction) layer 107 that is one of the features of the exemplary embodiments.

Another feature of the exemplary disclosure is that the first dielectric layer 109 and the second dielectric layer 113 can have a high modulus, being made of SiN or $SiO_2$, and also both these two layers (109 and 113) have the thickness and the internal stress of the dielectric adjusted to produce a net zero curvature or a close to zero curvature of substrate 101 after completion of the active semiconductor layer 107, or after completion of the IC (integrated circuit) chip. In some embodiments, the stress in dielectric 104 (of wiring layer 105) is tensile stress, and then the first dielectric layer 109 and the second dielectric layer 113 are deposited to have a compressive stress. The magnitude of the compressive stress is adjusted using, for example, deposition methods known in the art.

The second dielectric layer 113 can be a dielectric with passivation and diffusion barrier properties as well. There is the first semiconductor layer 111, where in order to keep it isolated from the environment and metal and other contaminants, a dielectric is included above and below (e.g. first dielectric 109 and second dielectric 113) the first semiconductor layer 111, where the dielectric meets certain predetermined barrier requirements. Therefore, not every type of dielectric may be appropriate.

Regarding the first dielectric layer 109, the first semiconductor layer 111 and the second dielectric layer 113 that form the active semiconductor layer 107, there can also be sublayers within or among any of those layers. A different sequence of the first dielectric layer 109, the first semiconductor layer 111 and the second dielectric layer 113 can be provided than the example in FIG. 3 to form the semiconductor or multi-function layer 107. However, preferably there can be a dielectric above and below the first semiconductor layer 111.

The active semiconductor layer 107 is added in the fabrication at the back-end. Therefore, a second active layer is fabricated or monolithically integrated during fabrication of the back-end wiring levels.

Figure 3:
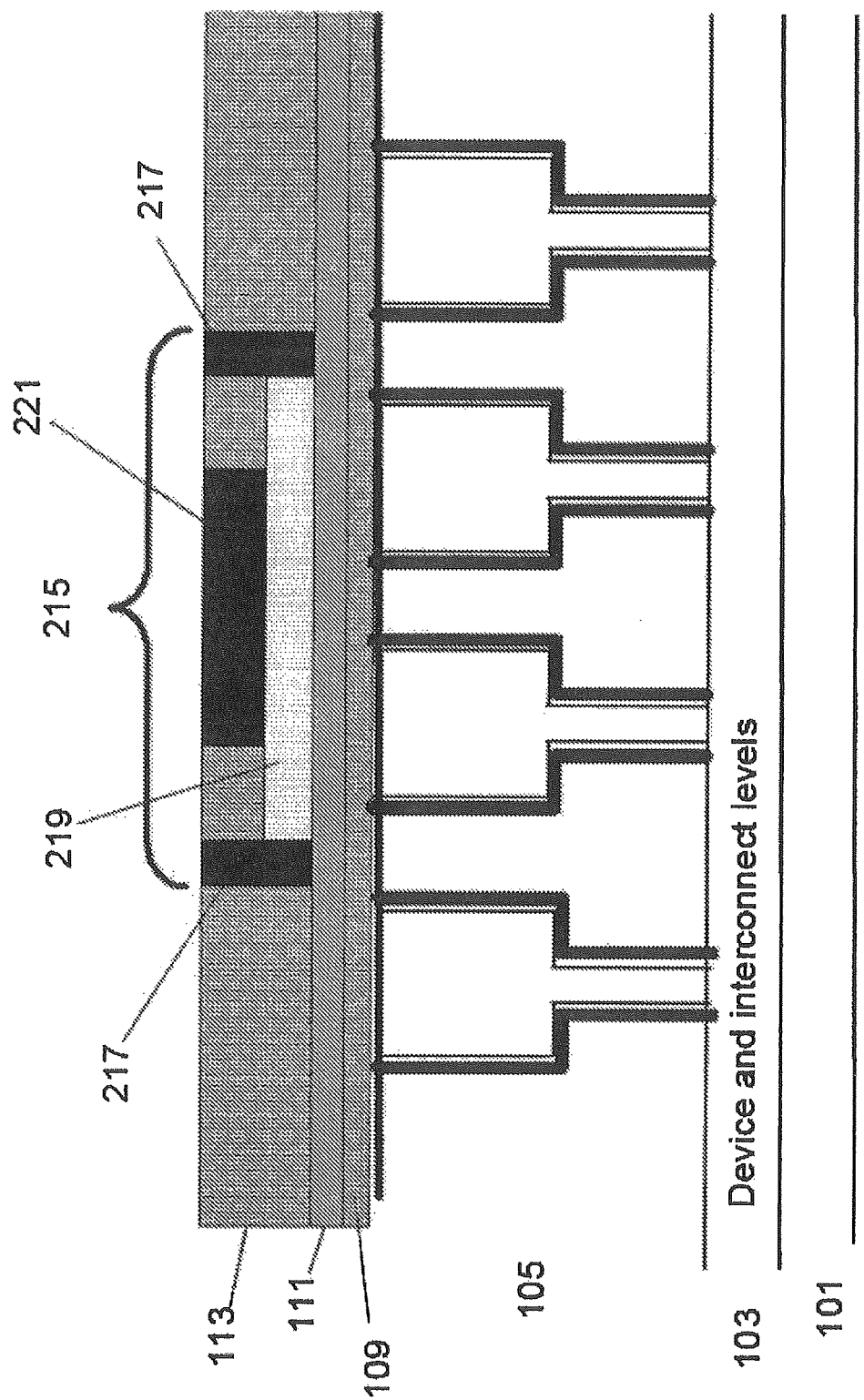
FIG. 3 illustrates a structure of transistors within the semiconductor active Si/SiN layer of an exemplary embodiment of the invention.

FIG. 3 illustrates a structure of the Si transistors within the first semiconductor (or Si/SiN device layer) layer 111. According to one exemplary embodiment, the structure of the Si transistors within the first semiconductor layer 111 is shown. FIG. 3 shows only one transistor structure 215 as an example for illustration purposes, although a plurality of such transistor structures 215 can be used, and all can have the general features shown in FIG. 3. The transistor structure 215 can be replaced with any of the devices or elements, but not limited to, as mentioned above through the above listed functions or features (1) to (6).

The transistor structure 215 is an example of a horizontal or lateral device formed in the first semiconductor layer 111. This structure is not shown to scale and may be larger or smaller in dimensions compared to the interconnect structure 105.

In some embodiments, the plurality of transistors (such as transistor 215) is connected in blocks, the blocks repeated across the integrated circuit area and the blocks providing circuit functions as described in detail above. In contact (e.g., direct contact) to the first semiconductor layer (Si layer) 111 are the source and drain contacts 217. Also in contact (e.g., direct contact) to the first semiconductor layer 111 is the gate dielectric layer 219.

Above the gate dielectric is the gate contact 221. Contacts 217 and 221 are made preferably of a conductor selected from a group of conductive materials. The conductor for contacts 217 and 221 can form an ohmic contact.

The gate dielectric 219 may include, for example but not limited to, $SiO_2$ or SiN or a deposited high dielectric constant insulator known in the art as a "high κ dielectric."

According to yet another exemplary embodiment, the device structures, such as the transistor structures can be generally similar to the above-mentioned exemplary embodiments, but the Si layer or first semiconductor layer is polycrystalline.

FIG. 3 is used to describe other exemplary transistor embodiments that may be fabricated in the first semiconductor layer 111. According to one exemplary embodiment, the gate layer 221 may be modified by adding a sub-layer within the gate 221 to change the interaction of the gate with the conducting channel 111. For example, a ferroelectric material layer is inserted within layer 221; this allows the transistor to be operated with a smaller gate voltage.

According to yet another exemplary embodiment, the contact material 217 is modified by adding a layer of ferromagnetic material and the source and drain contacts are operated to select colliers of 1-spin state. The non-linear device is then described as a spin-selected FET (spin-FET).

According to yet another exemplary embodiment, the channel layer 219 is engineered by the addition of energy barriers within the channel. The non-linear device is then described as a tunnel-FET structure.

Figure 4:
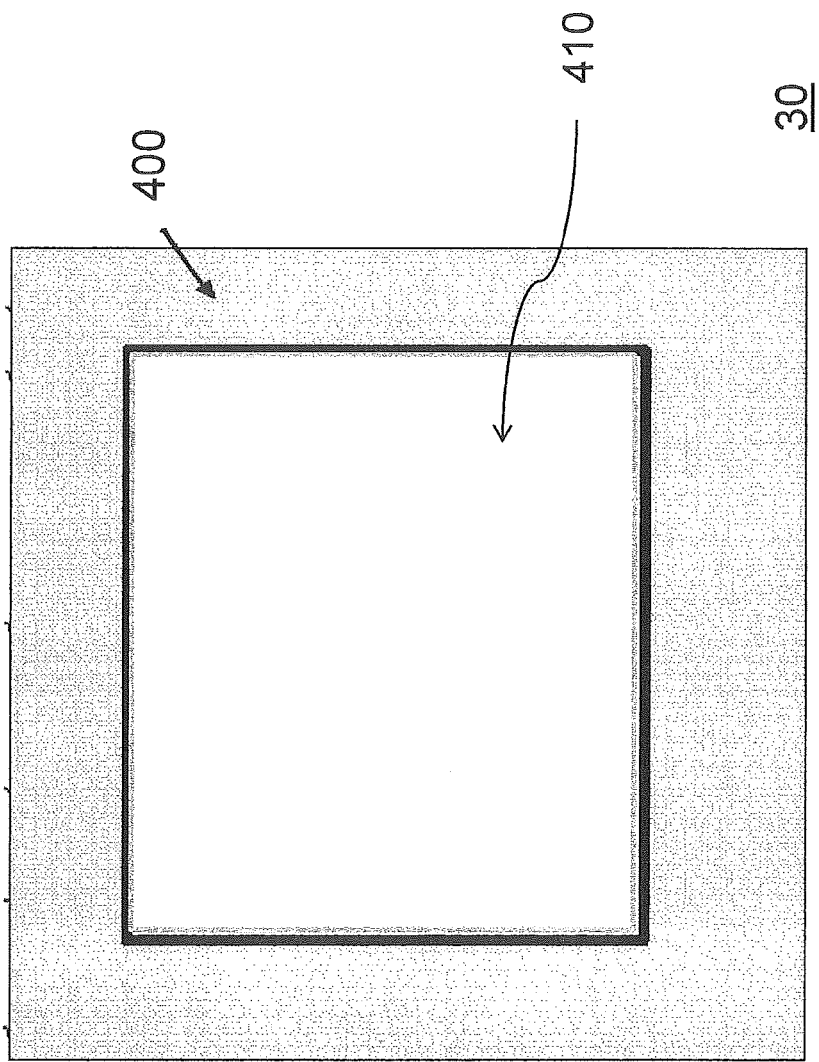
FIG. 4 shows a top view layout of the high mechanical strength layer.

FIG. 4 is a top view layout of a high mechanical strength semiconductor layer according to one exemplary embodiment. A first region 400 is near the integrated circuit chip 30 perimeter. The first region 400 is reserved for special active device functions, such as the nonlinear devices described above. The second region 410 may cover most of the integrated circuit chip 30.

Figure 5:
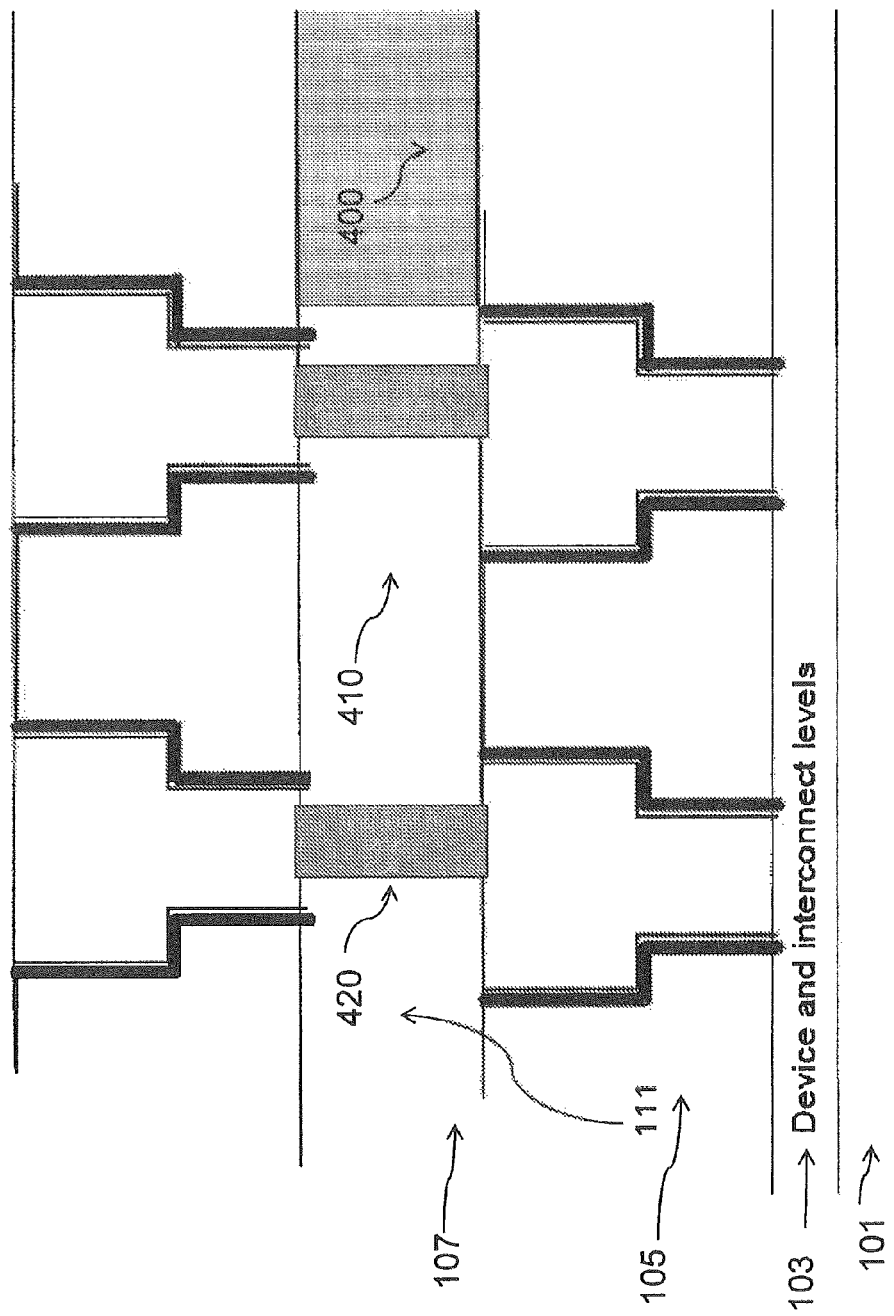
FIG. 5 illustrates a side view of the high mechanical strength layer placed between Cu damascene interconnect levels in the BEOL.

FIG. 5 includes a side view showing how the high mechanical strength layer (i.e. active semiconductor layer 107) is placed between Cu damascene interconnect levels (i.e. metal wiring levels 105) in the BEOL. A plurality of single damascene Cu vias 420 are built in SiN with high compression stress in the second region 410, which may cover most of the integrated circuit chip. The region 400 reserved for special active device functions is also shown.

The last ultralow dielectric (ULK) level can have a κ≤2.5 in the active semiconductor layer 107. Such a configuration can help, for example, to reduce RC (resistive-capacitive) delays, power consumption and cross-talk and thus achieve performance improvements.

Figure 6:
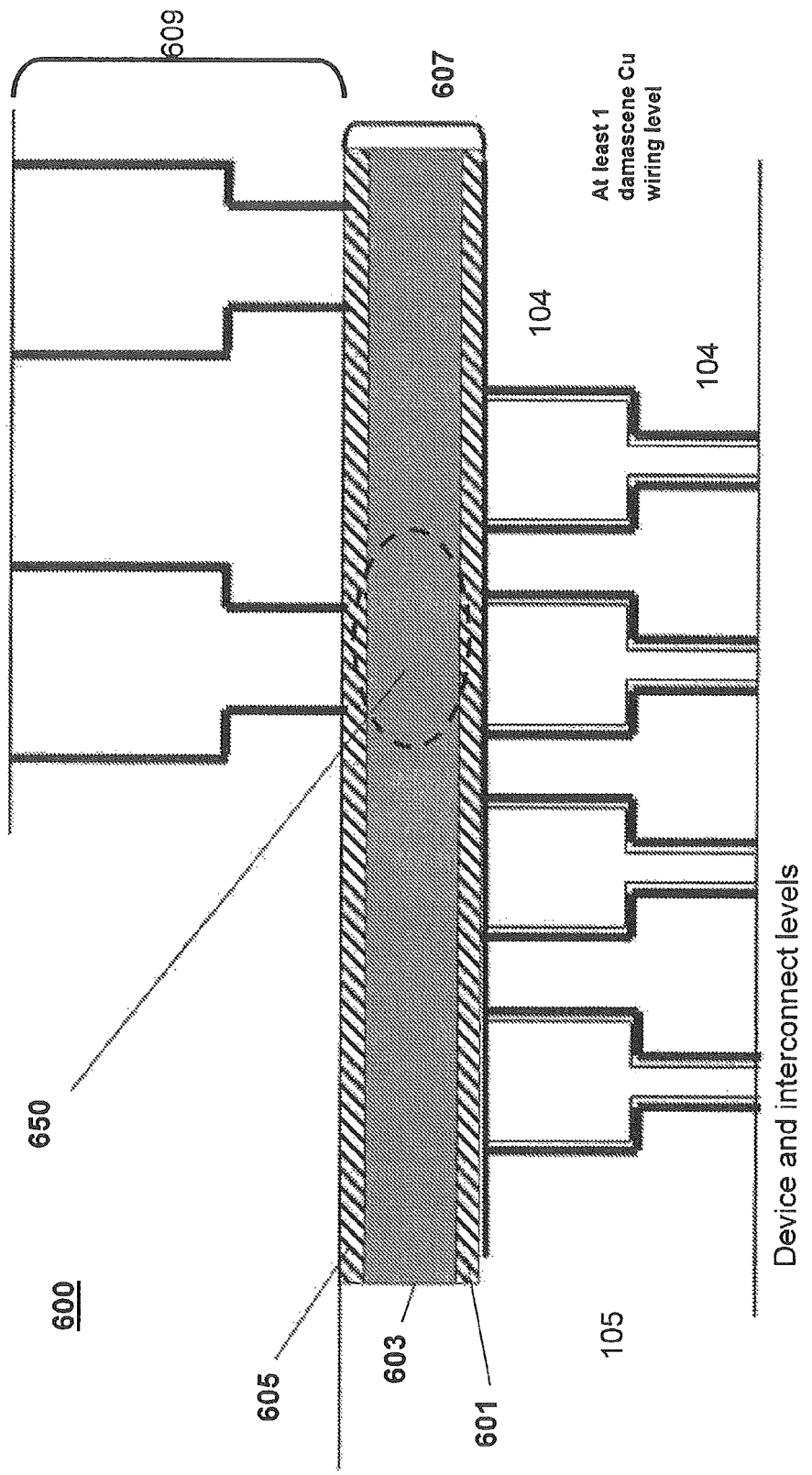
FIG. 6 illustrates a vertical diode nonlinear device.

FIG. 6 illustrates an exemplary vertical device 650. The example vertical semiconductor device 650, such as a P-N diode, in the general structure of this invention, is constructed in the BEOL wiring levels 105 of an integrated circuit chip 600. The exemplary vertical diode device 650 is located within a first semiconductor layer 603, which is surrounded above and below with a first dielectric layer 601 and a second dielectric layer 605. There are wiring levels 609 above and 105 below the device layer.

The active semiconductor layer 607 is formed with the combination of contact layers 601 and 605. FIG. 6 illustrates an example implementation of a vertical device 650. Generally, other than the illustration of vertical device 650 with the active semiconductor layer 607, the active semiconductor layer 607 can be similar to the semiconductor layer 107 of FIG. 2. The first semiconductor layer 603 of FIG. 6 can be similar to the first semiconductor layer 111 of FIG. 2. The second metal wiring level 609 is also shown above the active semiconductor layer 607.

Referring again to FIG. 6, below the first semiconductor layer 603 is a conductor contact layer 601. Above the first semiconductor layer 603 is a conductor contact layer 605. Together, the collection of layers 601, 603 and 605 comprise active device layer or the active semiconductor layer 607, within the BEOL. The function of the conductor layers 601 and 605 is, for example, to provide low contact resistance to the first semiconductor layer 603, while at the same time providing a diffusion barrier function. The diffusion barrier function, for example, prevents the interdiffusion or mixing or reaction of metal conductor components in the metal wiring layers 105 and 609 with the first semiconductor layer 603. The conductor contact layers 601 and 605 may further include additional sub-layers.

Example materials for the first semiconductor layer 603 include Si, Ge, C, alloys of Si, Ge, C, and any III-V or II-VI or other compound semiconductor material. Example materials for the conductor contact layers 601 and 605 include Ti, TiN, Ta, TaN, TaSiN, W, WN, etc., or these materials doped with C, or multi-layers of these materials.

Within the first semiconductor layer 603, a sub-layer structure is shown in FIGS. 7A and 7B. Referring to FIG. 7A, a P-N junction 611 and 613 is provided within the first semiconductor layer (active layer) 603.

The P-N junction diode includes layer 613 being p-type Si and layer 611 being an n-type Si, forming a P-N junction within the first semiconductor layer 603. Alternatively, the doping in layers 611 and 613 can be reversed.

Referring to FIG. 7B, a P-N junction 611 and 613 is provided within the first semiconductor layer (active layer) 603, and a Schottky barrier contact 615 is provided to the layer 613. Therefore, FIGS. 7A and 7B show two examples of sub-layer structures within a vertical first semiconductor layer 603.

The P-N junction diode (formed by layers 611 and 613) is in series with a Schottky contact 615 at the bottom contact of layer 613. Layer 615 is a metal contact selected to produce a Schottky barrier at the interface to layer 613. The doping in layers 611 and 613 can be adjusted to produce the desired diode characteristics.

Figure 8:
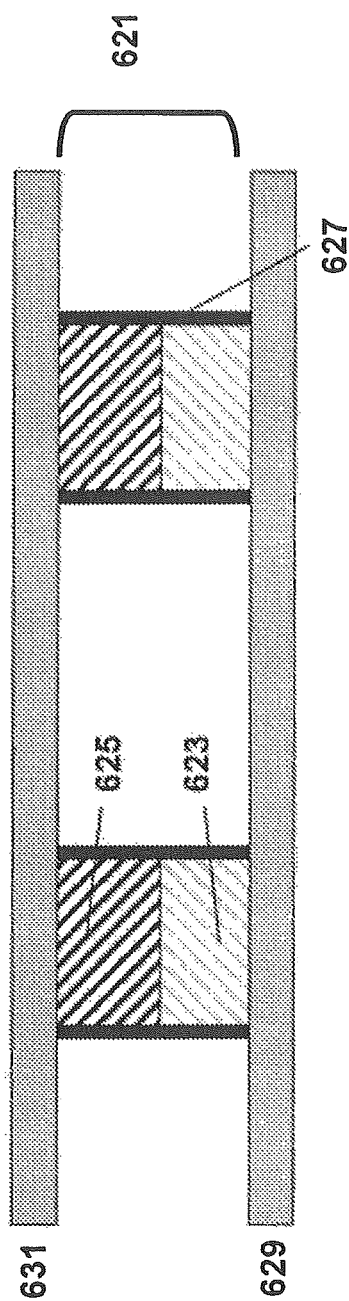
FIG. 8 shows a P-N junction diode constructed within a via etched in a dielectric, another exemplary nonlinear device.

FIG. 8 illustrates a P-N junction diode including layers 623 and 625 constructed within a via 627, etched in a dielectric layer 621. Below the layer 621 is a conductor contact layer of the first dielectric 629. Above the first semiconductor layer 621 is a conductor contact layer of the second dielectric 631. Together, the collection of layers 629, 631 and 621 form an active device layer or the active semiconductor layer, within the BEOL. The function of the layers 631 and 629 is, for example, to provide low contact resistance to the first semiconductor layer 621, while at the same time providing a diffusion barrier function. The layers 629 and 631 prevent the interdiffusion or mixing or reaction of metal conductor components in the metal wiring layers above and below the active semiconductor layer formed of layers 629, 631 and 621. The layers 629 and 631 may further include additional sub-layers.

Example materials for the first semiconductor layer 621 can include materials similar to the first semiconductor layer 603 of FIG. 6. Example materials for the conductor contact layers 629 and 631 can include material similar to layers 601 and 605 from FIG. 6.

Figure 9:
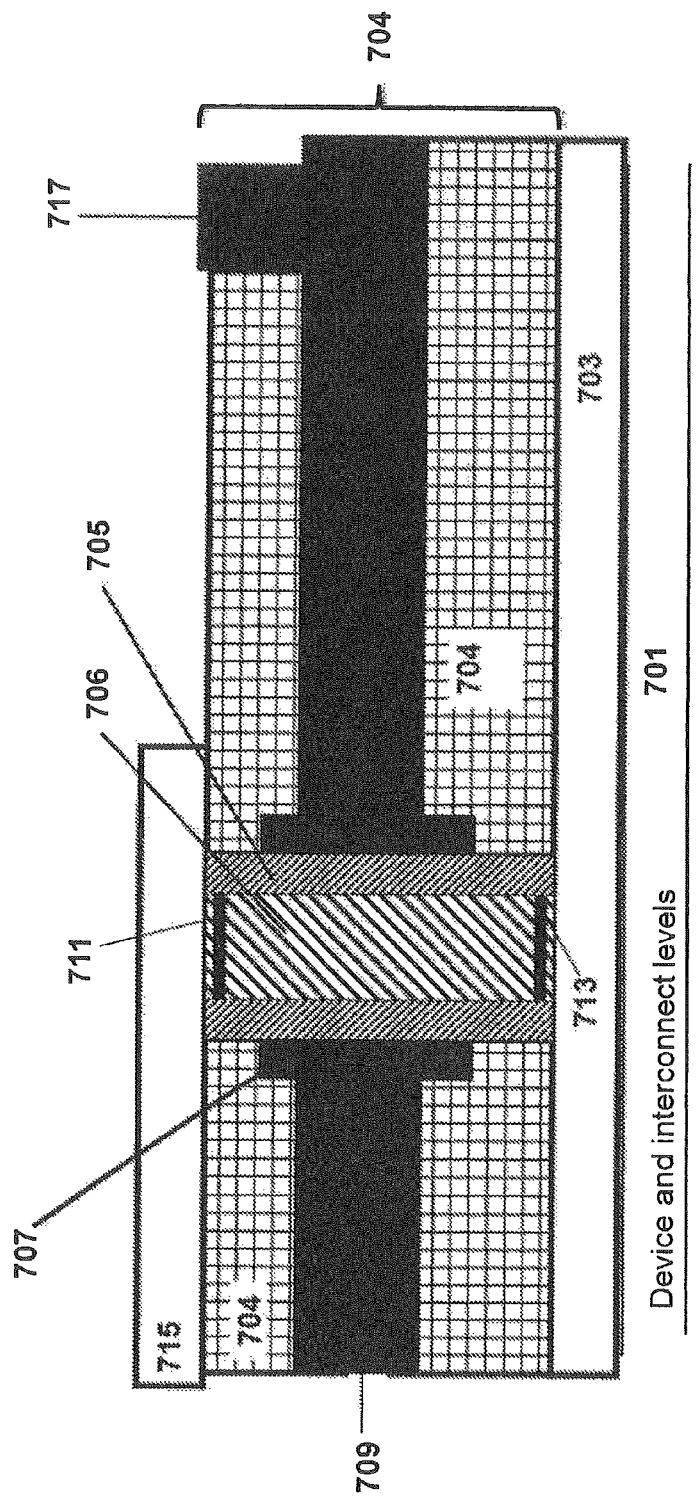
FIG. 9 is a section view of a vertical FET device, another exemplary nonlinear device.
Figure 10:
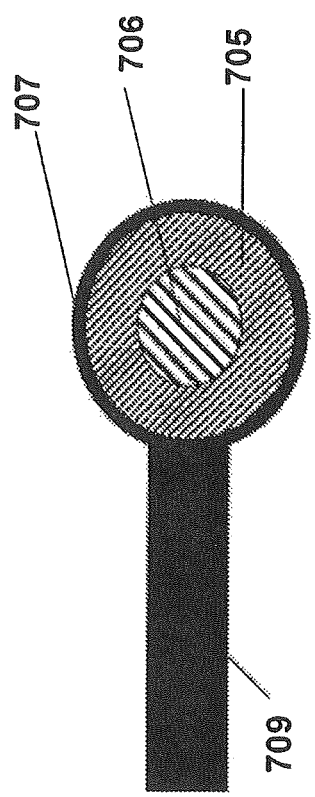
FIG. 10 is a top view of the vertical FET device of FIG. 9.

FIGS. 9 and 10 illustrate an example of a vertical FET (field-effect transistor) device. Above the device and interconnect levels 701 is a patterned wiring layer 703. Above the semiconductor device layer 704 is a second patterned wiring layer 715 and below is the patterned wiring layer 703. Together, layer 704, and the structure fabricated within this layer 715 form the active semiconductor layer. The vertical FET is formed from layers (705, 706, 707, 709 and also 711 and 713) in the first semiconductor layer 704. Layers 713 and 711 are conductor contact layers and can include material similar to layers 601 and 605 from FIG. 6. Material 705 is a diffusion barrier liner such as silicon nitride (e.g. $Si_3N_4$, $SiN_x$, SiN) that also acts as the gate dielectric, and may have other dielectric sub-layers at the interface to material 706. Material 706 is a semiconductor that can include materials similar to the first semiconductor layer 603 of FIG. 6. Structure 709 and 707 is a gate conductor to control the conduction within the conducting channel 706, with a connection to the upper wiring layer shown as 717.

FIG. 10 is a top view to clarify FIG. 9. Material 705 is a diffusion barrier liner that also acts as the gate dielectric, and may have other dielectric sub-layers at the interface to material 706. Material 706 is a semiconductor that can include materials similar to the first semiconductor layer 603 of FIG. 6. Structure 709 and 707 is a gate conductor. Structures 707 and 705 may surround the semiconductor 706, as shown, or may be foamed adjacent to 706 without surrounding the semiconductor.

The vertical FET structure of FIG. 9 can be modified as described above in reference to FIG. 3 to produce specific kinds of non-linear semiconductor devices. The non-linear semiconductor devices can include exemplary transistor embodiments that may be fabricated in the first semiconductor layer 704. According to one exemplary embodiment, the gate dielectric layer 705 is modified by adding a sub-layer within the gate 705 to change the interaction of the gate with the conducting channel 706. For example, a ferroelectric material layer is inserted within layer 705. This allows the transistor to be operated with a smaller gate voltage.

According to yet another exemplary embodiment, the contact material is modified by adding a layer of ferromagnetic material and the source and drain conductor contacts 711 and 713 are operated to select colliers of 1-spin state. The non-linear device is then described as a spin-selected FET (spin-FET).

According to yet another exemplary embodiment, the channel layer 706 is engineered by the addition of energy barriers within the channel. Therefore, as shown above, devices such as vertical and lateral devices can be included in the active semiconductor layer. Moreover, as shown above, the entire fabrication is provided in a single substrate.

Therefore, based on the foregoing exemplary embodiments of the invention, the BEOL structures incorporating active devices provide an increased circuit density without reducing performance and reliability.

Although examples of the BEOL structures incorporating active devices are shown, alternate embodiments are also possible, including for example, different active devices, different materials, additional sub-layers and additional wiring levels.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A circuit, comprising:
   a substrate;
   a plurality of semiconductor device layers monolithically formed on the substrate; and
   a wiring layer with vias interconnecting the plurality of semiconductor device layers.

2. The circuit according to claim 1, wherein the plurality of semiconductor device layers are devoid of bonding or joining interfaces to the substrate.

3. The circuit according to claim 1, further comprising a first dielectric layer deposited on the wiring layer,
   wherein the plurality of semiconductor device layers are interconnected by the wiring layer constructed within the first dielectric layer.

4. The circuit according to claim 3, wherein a second dielectric layer is deposited on one of the plurality of semiconductor device layers.

5. The circuit according to claim 3, wherein the first dielectric layer comprises a SiN layer or a SiCN layer located atop the wiring layer, and
   wherein at least one underlying damascene Cu wiring level is formed on a semiconductor device layer of the plurality of semiconductor device layers, the semiconductor device layer being integrally formed from the substrate.

6. The circuit according to claim 1, further comprising a plurality of nonlinear devices fabricated in the plurality of semiconductor device layers.

7. The circuit according to claim 1, wherein nonlinear devices are formed within a semiconductor device layer of the plurality of semiconductor device layers, the nonlinear devices being selected from at least one of varactors, field effect transistors, bipolar transistors, spin-enhanced field effect transistors, tunneling transistors, ferroelectric gate field effect transistors, tunnel diodes, junction diodes, photoemitters, lasers, photodetectors, waveguides, and photonic modulators.

8. The circuit according to claim 1, wherein linear devices are formed within a semiconductor device layer of the plurality of semiconductor device layers, the linear devices being selected from at least one of interconnects, metal thin film resistors, inductors, metal-insulator-metal (MIM) capacitors.

9. The circuit according to claim 1, further comprising a nonlinear device formed on at least one of the plurality of semiconductor device layers, the nonlinear device including a first conductor contacting a principal electrically conducting channel, a second conductor contacting the principal electrically conducting channel, and a control electrode, the control electrode regulating a current flow between the first conductor and the second conductor of the principal electrically conducting channel,
   wherein the nonlinear device includes the first conductor, the second conductor and control electrode connected to at least one wiring level from a plurality of the wiring layers.

10. The circuit according to claim 1, wherein at least one of the plurality of semiconductor device layers includes a plurality of transistors, and
    wherein gate, source, and drain contacts of the transistors are connected to a wiring level from the wiring layer comprising an overlying damascene Cu wiring level located above the transistors.

11. The circuit according to claim 10, wherein the gate, source, and drain contacts of the transistors are fabricated through a second dielectric layer deposited as an encapsulation layer surrounding the semiconductor device.

12. The circuit according to claim 11, wherein a silicon oxide layer is located at least on an upper interface or a lower interface between at least one of the semiconductor device layers and one of the first or second dielectric layers.

13. The circuit according to claim 1, further comprising a nonlinear device formed on at least one of the plurality of semiconductor device layers, the nonlinear device including a first conductor contacting a first semiconductor region of a first conductivity type and a second conductor contacting a semiconductor region of a second conductivity type, the first and second semiconductor regions providing a junction exhibiting a non-linear voltage-current characteristic for the nonlinear device between the first and second conductors,
    wherein the first and second conductors are connected to at least one of a plurality of wiring levels in a plurality of the wiring layers.

14. The circuit according to claim 1, wherein at least one of the plurality of semiconductor devices includes a plurality of nonlinear devices including at least first and second conductors,
    wherein the at least first and second conductors of the nonlinear devices are connected to a wiring level of the wiring layer comprising an overlying damascene Cu wiring level located above the nonlinear devices, and
    wherein at least the first and second conductors of the nonlinear devices are fabricated through a second dielectric layer deposited as an encapsulation layer surrounding the first and second conductors.

15. The circuit according to claim 14, wherein an intrinsic stress in the first and second dielectric layers is adjusted to a predetermined amount to minimize a net curvature of the substrate after completion of said second dielectric layer, and
    wherein a silicon oxide layer is located at least on an upper interface or a lower interface between at least one of the semiconductor device layers and one of the first or second dielectric layers.

16. A circuit, comprising:
    a substrate comprising a first semiconductor layer;
    a first wiring layer formed on the substrate;
    a first dielectric layer, including the first wiring layer, formed on the substrate; and
    a second semiconductor layer comprising an active device formed on the first dielectric layer and monolithically integrated with the substrate.

17. The circuit according to claim 16, further comprising a second dielectric layer formed on the second semiconductor layer; and
    a second wiring layer formed on the second dielectric layer,
    wherein the second semiconductor layer is located in a BEOL (back-end-of-line) interconnect structure, and
    wherein the second semiconductor layer comprises the active device formed on the first dielectric layer devoid of a bonding interface or a joining interface therebetween the second semiconductor layer and the first dielectric layer.

18. The circuit according to claim 16, wherein the second semiconductor device layer is discontinuous across the substrate, and
   wherein the first and second semiconductor device layers are formed on the substrate devoid of bonding or joining interfaces.

19. The circuit according to claim 16, wherein the active device is selected from at least one of varactors, field effect transistors, bipolar transistors, spin-enhanced field effect transistors, tunneling transistors, ferroelectric gate field effect transistors, tunnel diodes, junction diodes, photoemitters, lasers, photodetectors, waveguides, photonic modulators, interconnects, metal thin film resistors, inductors, and metal-insulator-metal (MIM) capacitors.

20. The circuit according to claim 1, wherein at least two levels of active devices are monolithically formed in the substrate,
   wherein the at least two levels of active devices are formed in a stepwise fashion in a single one of the substrate, and
   wherein a termination of at least one wiring level is formed with one of the plurality of semiconductor layers in which transistors and active circuits are located in the semiconductor layer and are connected as part of the circuit based on the substrate.

\* \* \* \* \*